US011739245B2

United States Patent
Takanashi et al.

(10) Patent No.: US 11,739,245 B2
(45) Date of Patent: *Aug. 29, 2023

(54) THERMALLY CONDUCTIVE POLYORGANOSILOXANE COMPOSITION

(71) Applicant: MOMENTIVE PERFORMANCE MATERIALS JAPAN LLC, Tokyo (JP)

(72) Inventors: Masanori Takanashi, Tokyo (JP); Isao Iida, Tokyo (JP); Daigo Hirakawa, Tokyo (JP); Kenji Takenaka, Tokyo (JP); Eiji Tanigawa, Tokyo (JP)

(73) Assignee: MOMENTIVE PERFORMANCE MATERIALS JAPAN LLC, Tokyo (JP)

( * ) Notice: Subject to any disclaimer, the term of this patent is extended or adjusted under 35 U.S.C. 154(b) by 986 days.

This patent is subject to a terminal disclaimer.

(21) Appl. No.: 16/319,612

(22) PCT Filed: Jul. 20, 2017

(86) PCT No.: PCT/JP2017/026217
§ 371 (c)(1),
(2) Date: Jan. 22, 2019

(87) PCT Pub. No.: WO2018/016564
PCT Pub. Date: Jan. 25, 2018

(65) Prior Publication Data
US 2021/0147738 A1 May 20, 2021

(30) Foreign Application Priority Data

Jul. 22, 2016 (JP) ................................ 2016-144431
Jul. 22, 2016 (JP) ................................ 2016-144432
Jul. 22, 2016 (JP) ................................ 2016-144433

(51) Int. Cl.
*C09K 5/14* (2006.01)
*C08G 77/08* (2006.01)
*C08G 77/12* (2006.01)
*C08G 77/18* (2006.01)
*C08K 3/22* (2006.01)
*C08K 3/28* (2006.01)
*H05K 7/20* (2006.01)
*C08G 77/20* (2006.01)

(52) U.S. Cl.
CPC ................ *C09K 5/14* (2013.01); *C08G 77/08* (2013.01); *C08G 77/12* (2013.01); *C08G 77/18* (2013.01); *C08K 3/22* (2013.01); *C08K 3/28* (2013.01); *H05K 7/2039* (2013.01); *C08G 77/20* (2013.01); *C08K 2003/2227* (2013.01); *C08K 2003/282* (2013.01); *C08K 2201/001* (2013.01)

(58) Field of Classification Search
CPC .......... C08G 77/08; C08G 77/12; C08K 3/22; C08K 3/28; C08K 2003/2227; C08K 2003/282; C08K 2201/001; C09K 5/14; H05K 7/2039
See application file for complete search history.

(56) References Cited

U.S. PATENT DOCUMENTS

| 6,306,957 | B1 | 10/2001 | Nakano et al. | |
| 11,142,644 | B2 * | 10/2021 | Hirakawa | C08K 5/54 |
| 2003/0229174 | A1 | 12/2003 | Goto et al. | |
| 2007/0185259 | A1 * | 8/2007 | Hoshino | C08L 83/06 |
| | | | | 524/588 |
| 2021/0130615 | A1 * | 5/2021 | Hirakawa | C08K 3/22 |

FOREIGN PATENT DOCUMENTS

| JP | 2000256558 | A | | 9/2000 |
| JP | 2001248483 | A | | 9/2001 |
| JP | 2002003831 | A | | 1/2002 |
| JP | 2003213133 | A | | 7/2003 |
| JP | 2004210856 | A | | 7/2004 |
| JP | 2005162975 | A | | 6/2005 |
| JP | 2008150439 | A | * | 7/2008 |
| JP | 2008266449 | A | | 11/2008 |
| JP | 2009203373 | A | | 9/2009 |
| JP | 2009215362 | A | * | 9/2009 |
| JP | 2012107152 | A | | 6/2012 |
| JP | 2014084403 | A | | 5/2014 |
| JP | 2015140395 | A | | 8/2015 |
| JP | 2017008218 | A | | 1/2017 |
| JP | 2017181036 | A | | 10/2017 |
| WO | 2005030874 | A1 | | 4/2005 |

OTHER PUBLICATIONS

Japanese Office Action (and English language translation thereof) dated Jan. 26, 2021 issued in Japanese Application No. 2018-022924.
International Search Report (ISR) dated Sep. 12, 2017 issued in International Application No. PCT/JP2017/026217.
Written Opinion dated Sep. 12, 2017 issued in International Application No. PCT/JP2017/026217.
Japanese Office Action dated Dec. 12, 2017 (and English translation thereof) issued in counterpart Japanese Application No. 2017-539673.
Japanese Office Action (and English language translation thereof) dated May 31, 2022, issued in Japanese Application No. 2021-089467.

* cited by examiner

*Primary Examiner* — James C Goloboy
(74) *Attorney, Agent, or Firm* — Holtz, Holtz & Volek PC

(57) ABSTRACT

A thermally conductive polysiloxane composition includes (A) a thermally conductive filler, (B) a polyorganosiloxane resin including at least one polysiloxane having one curable functional group in the molecule thereof, and (C) a siloxane compound having an alkoxysilyl group and a linear siloxane structure.

14 Claims, No Drawings

US 11,739,245 B2

THERMALLY CONDUCTIVE POLYORGANOSILOXANE COMPOSITION

FIELD OF THE INVENTION

The present invention relates to a thermally conductive polyorganosiloxane composition.

BACKGROUND ART

In electronic parts, such as a power transistor, an IC, and a CPU, for preventing accumulation of heat caused due to electrical heating elements, a thermally conductive grease or a thermally conductive sheet having high thermal conductivity is used. The thermally conductive sheet does not stain or break other parts or does not cause an oil component to ooze out of the sheet, and has been widely used in electronic parts which are required to have high precision. The thermally conductive sheet generally has poorer adhesion than the grease, but, for removing such a disadvantage, a method is employed in which the hardness of the thermally conductive sheet is reduced to improve the adhesion of the sheet. The thermally conductive grease is a fluid material having a high viscosity, and therefore can fill a very small space caused between a heating element and a radiator to exhibit high radiator performance. Further, the thermally conductive grease has an advantage in that the grease can be easily applied to an electronic part irrespective of the shape of the electronic part.

In the thermally conductive sheet or thermally conductive grease, silicone rubbers having an advantage in that a change of the viscosity is small in a wide temperature range are widely used. Silicone cannot enhance the thermal conductivity by itself and therefore, for improving the silicone rubber in thermal conductivity, a thermally conductive filler and the silicone rubber are used in combination. It has been known that, as a thermally conductive filler, a material having higher thermal conductivity than that of a silicone as a binder, such as a silica powder, alumina, boron nitride, aluminum nitride, or magnesium oxide, is added (Japanese Unexamined Patent Publication No. 2002-003831).

Electronic parts recently used and others likely generate heat in an increased amount as electronic devices have increasingly high output, and thus a radiator member having an even higher thermal conductivity is required. For obtaining a silicone composition having a high thermal conductivity for meeting the above demand, it is necessary to fill the composition with a thermally conductive filler at a higher filling ratio. However, the thermally conductive filler has a limitation of the filling property due to, for example, deterioration of the fluidity. Therefore, an improvement of the filling property by subjecting the thermally conductive filler to surface treatment has been known (see Japanese Patent Application prior-to-examination Publication (saikohyo) No. 2005/030874 and Japanese Unexamined Patent Publication Nos. 2000-256558 and 2003-213133).

PRIOR ART REFERENCES

Patent Documents

Patent document 1: Japanese Unexamined Patent Publication No. 2002-003831
Patent document 2: Japanese Patent Application prior-to-examination Publication (saikohyo) No. 2005/030874
Patent document 3: Japanese Unexamined Patent Publication No. 2000-256558
Patent document 4: Japanese Unexamined Patent Publication No. 2003-213133

SUMMARY OF THE INVENTION

Problems to be Solved by the Invention

The composition comprising a thermally conductive filler and a silicone is essentially required to have thermal conductivity and therefore, for achieving high radiator performance, inorganic particles, such as alumina having a very small particle diameter, which have been subjected to surface treatment, are used in the composition. Such a thermally conductive composition has high radiator performance; however, after the thermally conductive composition using a conventionally known surface treatment agent is cured, a phenomenon is observed in which the hardness of the cured composition is lowered with the passage of time, and thus the composition has a problem about the stability. When the hardness of the thermally conductive composition does not remain constant but lowers, the reliability of the electronic part itself is adversely affected, and therefore an attempt to find a thermally conductive material having excellent stability is desired. Further, the composition comprising a thermally conductive filler and a silicone is required to have a viscosity such that the composition is easy to handle when applying the composition to an electronic part, and required to have appropriate elastic properties after being cured for cushioning the electronic part. However, the addition of a component having high fluidity, such as an oil, in order to reduce the viscosity/hardness causes a lowering of the thermal conductivity. Further, the composition applied to an electronic part has a certain pressure exerted from the part, and hence a phenomenon called bleeding inevitably occurs in which the added oil oozes out of the thermally conductive composition with the passage of time. Bleeding likely causes deterioration of the thermally conductive composition and further causes the electronic part to malfunction.

As mentioned above, with respect to the thermally conductive composition having high radiator properties, there are still a number of properties to be improved, and the development of a composition which has further properties while maintaining the properties required for the thermally conductive composition has been desired. The present invention has been made for solving the above problems, and an object of the present invention is to provide a thermally conductive polysiloxane composition advantageously used in a thermally conductive sheet or a thermally conductive grease, which has further excellent handling properties while maintaining excellent performance for the working properties and thermal conductivity, or which forms a cured product having, e.g., excellent stability and bleed resistance.

Means for Solving the Problems

The present inventors have conducted extensive and intensive studies with a view toward solving the above-mentioned problems. As a result, it has been found that, by appropriately designing the surface treatment agent and specifying the type of the additive, there can be obtained a thermally conductive polysiloxane composition having a viscosity such that the composition is easy to handle, and further properties are obtained such that the thermally conductive polysiloxane composition after cured has improved stability and an improved bleed resistance, and the present invention has been completed.

The present invention is directed to the following items.

[1] A thermally conductive polysiloxane composition comprising:

(A) a thermally conductive filler, (B) a polyorganosiloxane resin comprising at least one polysiloxane having one curable functional group in the molecule thereof and (C) a siloxane compound having an alkoxysilyl group and a linear siloxane structure.

[2] The thermally conductive polysiloxane composition according to item [1] above, wherein the content of the polysiloxane having one curable functional group in the molecule thereof in the polyorganosiloxane resin (B) is in the range of from 20 to 80% by mass.

[3] The thermally conductive polysiloxane composition according to item [1] or [2] above, wherein the polysiloxane having one curable functional group in the molecule thereof is a linear polyorganosiloxane having one vinyl group at an end thereof.

[4] The thermally conductive polysiloxane composition according to any one of items [1] to [3] above, wherein the siloxane compound (C) having an alkoxysilyl group and a linear siloxane structure is a siloxane compound represented by the following general formula (1):

[Chemical formula 1]

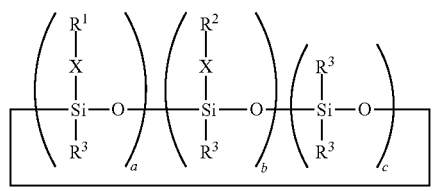

(1)

wherein:
$R^1$ is a group having an alkoxysilyl group having 1 to 4 carbon atoms;
$R^2$ is a linear organosiloxy group represented by the following general formula (2):

[Chemical formula 2]

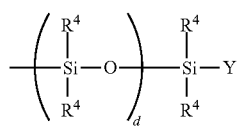

(2)

wherein each $R^4$ is independently a monovalent hydrocarbon group having 1 to 12 carbon atoms, Y is a group selected from the group consisting of methyl, vinyl, and $R^1$, and d is an integer of 2 to 60;
each X is independently a divalent hydrocarbon group having 2 to 10 carbon atoms;
each of a and b is independently an integer of 1 or more;
c is an integer of 0 or more;
a+b+c is an integer of 4 or more; and
each $R^3$ is independently a monovalent hydrocarbon group having 1 to 6 carbon atoms, or a hydrogen atom.

[5] The thermally conductive polysiloxane composition according to item [4] above, wherein, in the general formula (1), b is 2, and d is 11 to 30.

[6] The thermally conductive polysiloxane composition according to item [4] above, wherein, in the general formula (1), b is 1.

[7] A thermally conductive polysiloxane composition comprising:

(A) a thermally conductive filler, (B') a polyorganosiloxane resin having at least two curable functional groups per molecule, and (C) a siloxane compound having an alkoxysilyl group and a linear siloxane structure, wherein the siloxane compound (C) is a siloxane compound represented by the following general formula (1):

[Chemical formula 3]

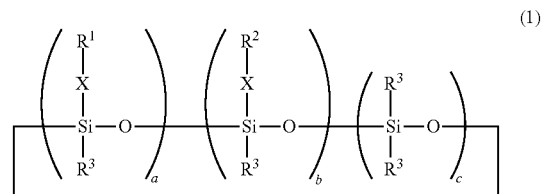

(1)

wherein, in the above formula and the formula (2) included in $R^2$, $R^1$ to $R^4$, Y, X, a, b, c, and a+b+c are as defined above, and d is an integer of 1 to 60, wherein the number of the units represented by —$SiR^4_2O$— per molecule of the siloxane compound represented by the general formula (1) is 10 to 60 in total.

[8] The thermally conductive polysiloxane composition according to item [7] above, wherein, in the general formula (1), b is 2, and, in the general formula (2), d is 10 to 30.

[9] The thermally conductive polysiloxane composition according to item [7] above, wherein, in the general formula (1), b is 1.

[10] The thermally conductive polysiloxane composition according to any one of items [1] to [9] above, which is of an addition-reaction curing type.

[11] The thermally conductive polysiloxane composition according to item

[10] above, further comprising an organohydrogenpolysiloxane having a hydrogen atom bonded to a silicon atom and a platinum catalyst.

[12] A thermally conductive polysiloxane composition comprising the thermally conductive polysiloxane composition according to any one of items [1] to [6] above, which is of an addition-reaction curing type, an organohydrogenpolysiloxane having a hydrogen atom bonded to a silicon atom, and a platinum catalyst, wherein the mass ratio of the hydrogen directly bonded to silicon to the vinyl group contained in the composition (H/Vi ratio) is in the range of from 0.2 to 2.0.

[13] A thermally conductive silicone grease substantially comprising:

a thermally conductive filler, a polyorganosiloxane resin, and a siloxane compound represented by the following general formula (1):

[Chemical formula 4]

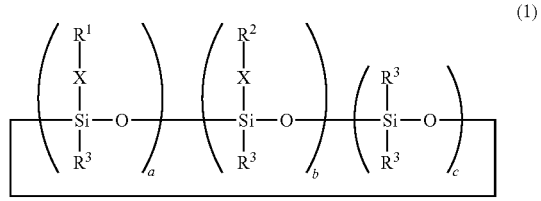

wherein $R^1$ to $R^4$, Y, X, a, b, c, and a+b+c are as defined above, and d is an integer of 1 to 100, wherein the number of the units represented by —$SiR^4_2O$— per molecule of the siloxane compound represented by the general formula (1) is 1 to 150 in total.

[14] The thermally conductive silicone grease according to item [13] above, wherein, in the general formula (1), b is 2.

[15] The thermally conductive silicone grease according to item [13] above, wherein, in the general formula (1), b is 1, and, in the general formula (2), d is 20 to 70.

[16] A silicone rubber which is obtained by curing the thermally conductive polysiloxane composition according to any one of items [10] to [12] above.

[17] An electronic part comprising the thermally conductive silicone grease according to any one of items [13] to [15] above or the silicone rubber according to item [16] above.

Effects of the Invention

In the present invention, there can be provided a thermally conductive polysiloxane composition which is advantageous not only in that the composition has excellent working properties and heat resistance as in a conventional composition, but also in that the occurrence of bleeding can be suppressed or a cured product of the composition exhibits excellent stability. Further, there can be provided a thermally conductive silicone grease having both excellent thermal conductivity and excellent handling properties.

MODE FOR CARRYING OUT THE INVENTION

<<First Invention>>

In the first invention, an embodiment is a thermally conductive polysiloxane composition which comprises a thermally conductive filler, a siloxane compound as a surface treatment agent, and a polysiloxane resin having at least one siloxane having a curable functional group at one position of the molecular ends thereof. Hereinbelow, the components contained in the composition, the method for producing the composition and others will be described in detail.

[Thermally Conductive Filler]

Examples of thermally conductive fillers include generally known inorganic fillers, such as alumina, magnesium oxide, zinc oxide, boron nitride, aluminum nitride, a silica powder, silicon carbide, a metal powder, diamond, aluminum hydroxide, and carbon. Especially preferred are alumina, zinc oxide, aluminum nitride, and silicon carbide. With respect to the inorganic filler, there is no particular limitation as long as it is of a grade that can be used as a thermally conductive filler, and those which are commercially available can be used. Further, a plurality of types of inorganic fillers of different chemical species can be used in combination.

With respect to the average particle diameter of the thermally conductive filler, there is no particular limitation as long as the thermally conductive filler is of a grade that can be used as a thermally conductive filler, but a thermally conductive filler having an average particle diameter of 300 μm or less is preferably used. With respect to the thermally conductive filler having an average particle diameter in the above range, when the thermally conductive filler having a larger average particle diameter is incorporated, the filling ratio cannot be increased. On the other hand, when the thermally conductive filler having a smaller average particle diameter is incorporated, the resultant composition tends to have an increased viscosity. By incorporating the thermally conductive filler having an appropriately selected average particle diameter, a composition having a viscosity suitable for the purpose can be obtained.

With respect to the thermally conductive filler, it is preferred that a filler having a relatively large particle diameter and a filler having a relatively small particle diameter are used in combination. By using a plurality of types of fillers having different particle diameters in combination, the filler having a relatively small particle diameter goes into voids caused in the filler having a relatively large particle diameter, enabling higher filling. According to the average particle diameter, the filler can be classified into a filler having a larger particle diameter (for example, a particle diameter of 30 μm or more), a filler having an intermediate particle diameter (for example, a particle diameter of 1 to less than 30 sm), and a filler having a smaller particle diameter (for example, a particle diameter of less than 1 μm), and at least two or more types, particularly three types of these fillers are preferably used. When a plurality of types of fillers having different particle diameters are used, the proportion of the fillers incorporated can be arbitrary. However, from the viewpoint of the working properties of the preparation of the composition and the thermal conductivity of the obtained composition, the filler having a larger particle diameter is preferably in an amount of 30 to 70% by mass, more preferably 35 to 65% by mass. When three types of fillers having a larger particle diameter, an intermediate particle diameter, and a smaller particle diameter are used, the ratio of the incorporated filler having an intermediate particle diameter and filler having a smaller particle diameter is preferably in the range of from 1:40 to 40:1, more preferably in the range of from 1:7 to 7:1.

With respect to the shape of the inorganic particles used as the thermally conductive filler, there is no particular limitation. For example, any of particles of a spherical shape, particles of a rounded shape, and particles of an indefinite shape can be used, and further two or more types of these particles can be used in combination. In the case where the inorganic particles have a rounded shape or an indefinite shape, the average particle diameter of the inorganic particles is defined by a method known to those skilled in the art. The average particle diameter can be determined as, for example, a weight average value (or a median diameter) using a particle size distribution measurement apparatus by, for example, a laser light diffraction method.

The amount of the thermally conductive filler incorporated into the thermally conductive polysiloxane resin is in the range of from 10 to 5,000 parts by mass, relative to 100 parts by mass of the total of the siloxane compound and the polyorganosiloxane resin having at least two curable functional groups. When the amount of the thermally conductive filler is preferably in the range of from 50 to 4,000 parts by mass, more preferably in the range of from 100 to 3,000 parts by mass, the effects of the present invention are more remarkably exhibited.

[Siloxane Compound]

In the first invention, the thermally conductive polysiloxane composition contains a siloxane compound having (i) an alkoxysilyl group and (ii) a linear siloxane structure as a surface treatment agent.

With respect to the molecular structure of the siloxane compound as a surface treatment agent, there is no particular limitation as long as the compound has the structure indicated by (i) and (ii) above, and any of linear, branched, and cyclic compounds can be used. As a preferred example of the siloxane compound, there can be mentioned a compound having the structure indicated by (i) and (ii) above in a side chain of the cyclic siloxane, for example, a siloxane compound represented by the following general formula (1):

[Chemical formula 5]

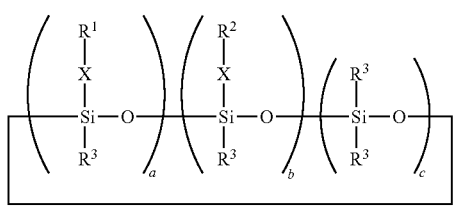

(1)

wherein:

$R^1$ is a group having an alkoxysilyl group having 1 to 4 carbon atoms;

$R^2$ is a linear organosiloxy group represented by the following general formula (2):

[Chemical formula 6]

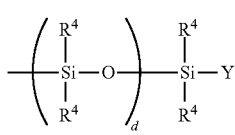

(2)

wherein each $R^4$ is independently a monovalent hydrocarbon group having 1 to 12 carbon atoms, Y is a group selected from the group consisting of methyl, vinyl, and $R^1$, and d is an integer of 2 to 60;

each X is independently a divalent hydrocarbon group having 2 to 10 carbon atoms;

each of a and b is independently an integer of 1 or more;

c is an integer of 0 or more;

a+b+c is an integer of 4 or more; and each $R^3$ is independently a monovalent hydrocarbon group having 1 to 6 carbon atoms, or a hydrogen atom.

In the siloxane compound, the unit containing $R^1$, the unit containing $R^2$, and the unit represented by $SiR^3_2O$ are not necessarily arranged as shown in the general formula (1) above, and it is understood that, for example, the unit represented by $SiR^3_2O$ may be present between the unit containing $R^1$ and the unit containing $R^2$.

The siloxane compound having the cyclic structure represented by the general formula (1) can have introduced a large number of hydrolyzable groups into the cyclic structure, and further has the hydrolyzable groups concentrated in the position of the structure, and therefore is considered to have an increased treatment efficiency for a thermally conductive filler, enabling higher filling. In addition, the siloxane compound Mg se has high heat resistance, and therefore can cause the thermally conductive polysiloxane composition to have high heat resistance. Further, such a siloxane compound has an advantage in that the compound can be easily obtained by, for example, subjecting to addition reaction a cyclic siloxane containing a hydrogen group, a siloxane having a vinyl group at one end thereof, and a silane compound containing a vinyl group and a hydrolyzable group.

In the general formula (1), $R^1$ is a hydrolyzable functional group containing an alkoxysilyl group having 1 to 4 carbon atoms, and, as more specific examples, there can be mentioned groups having the structures shown below. $R^1$ may be directly bonded to X with silicon, but may be bonded to X through a linking group, such as an ester linkage. More specific examples of $R^1$'s include groups having the structures shown below.

[Chemical formula 7]

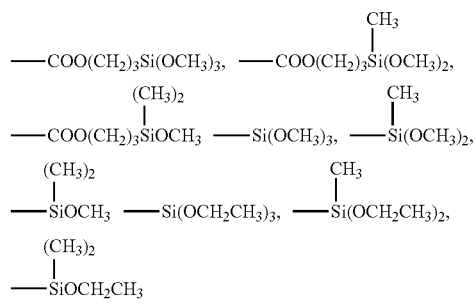

Especially, in view of a tendency toward a further improvement of the treatment efficiency for the thermally conductive filler, $R^1$ is preferably a group of a structure having two or more alkoxysilyl groups, particularly having three alkoxysilyl groups. Further, in view of easy availability of the raw material, $R^1$ preferably contains a methoxysilyl group.

$R^2$ is selected from an oligosiloxane and a long-chain alkyl group. When $R^2$ is a long-chain alkyl group, the number of carbon atoms of the long-chain alkyl group is in the range of from 6 to 18, preferably 6 to 14. The term "long-chain alkyl group" means an alkyl group of which the longest carbon chain portion has 6 or more carbon atoms, and the long-chain alkyl group may have a branched structure as long as the total number of carbon atoms falls in the above-mentioned range. When the number of carbon atoms of the long-chain alkyl group is in the above range, the effect on the fluidity is improved, enabling high incorporation. Further, excellent handling properties are achieved, making uniform dispersion easy.

When $R^2$ is an oligosiloxane, $R^2$ is a group represented by the following general formula (2):

[Chemical formula 8]

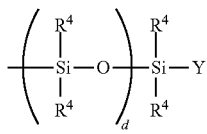

(2)

wherein $R^4$, Y, and d are as defined above.

In the general formula (2), the value of d is in the range of from 2 to 500, preferably in the range of from 4 to 400, more preferably in the range of from 10 to 200, especially preferably in the range of from 10 to 60. When d is in the above range, the effect on the fluidity is improved, enabling high incorporation, so that the viscosity of the siloxane compound per se can be reduced. Each $R^4$ is independently a monovalent hydrocarbon group having 1 to 12 carbon atoms, and examples of $R^4$'s include linear or branched $C_{1-12}$ alkyl groups, and aryl groups, such as phenyl and naphthyl. $R^4$ may be substituted with a halogen, such as chlorine, fluorine, or bromine, and examples of such groups include perfluoroalkyl groups, such as a trifluoromethyl group. In view of easy synthesis of the compound, $R^4$ is preferably a methyl group. Y is a group selected from the group consisting of $R^1$, $R^4$, and an aliphatic unsaturated group. The aliphatic unsaturated group preferably has 2 to 10 carbon atoms, more preferably 2 to 6 carbon atoms. The aliphatic unsaturated group easily undergoes a curing reaction, and therefore preferably has a double bond at an end thereof. In view of easy synthesis of the compound, Y is preferably a methyl group or a vinyl group. $R^2$ is preferably the above-mentioned oligosiloxane because it is likely that the resultant siloxane compound enhances the affinity through the thermally conductive filler and base polymer, so that a composition having excellent handling properties, for example, having a reduced viscosity can be obtained.

$R^1$ and $R^2$ are individually bonded through group X to the cyclic siloxane portion of the siloxane represented by the general formula (1). Group X is a divalent hydrocarbon group having 2 to 10 carbon atoms, and examples of such groups include alkylene groups, such as $-CH_2CH_2-$, $-CH_2CH_2CH_2-$, $-CH_2CH_2CH_2CH_2CH_2CH_2-$, $-CH_2CH(CH_3)-$, and $-CH_2CH(CH_3)CH_2-$. In view of easy synthesis of the compound, X is preferably $-CH_2CH_2-$ or $-CH_2CH(CH_3)-$.

Each $R^3$ is independently a monovalent hydrocarbon group having 1 to 6 carbon atoms, or a hydrogen atom. $R^3$'s may be the same or different. In view of easy synthesis of the compound, $R^3$ is preferably a methyl group or a hydrogen atom.

a is an integer of 1 or more, preferably 1. b is an integer of 1 or more, preferably 1 or 2. c is an integer of 0 or more, preferably 0 to 2. The total of a+b+c is an integer of 4 or more, but is preferably 4 in view of easy synthesis of the compound. When b is 2, $R^2$ is preferably selected so that the number of the units represented by $-SiR^4{}_2O-$ in $R^2$ becomes 10 to 60 in total from the viewpoint of the handling properties. Such an embodiment is achieved by selecting $R^2$ so that, for example, b is 1, or b is 2 and d is 11 to 30.

As representative examples of the above-described siloxane compounds, there can be mentioned compounds represented by the structural formulae shown below, but the present invention is not limited to these compounds.

[Chemical formula 9]

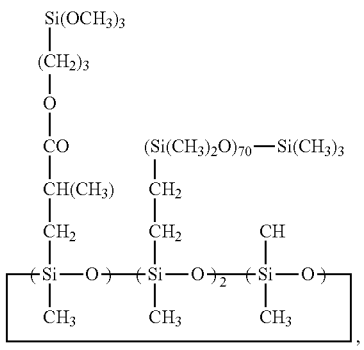

,

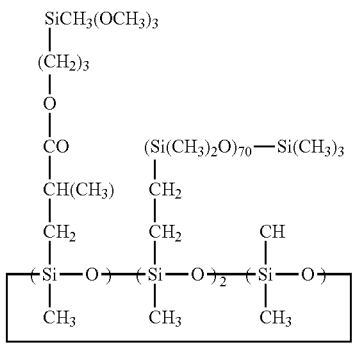

,

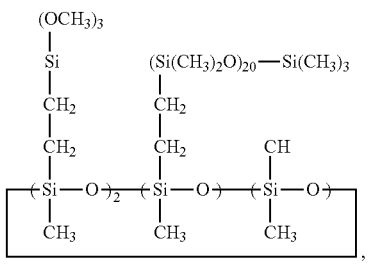

,

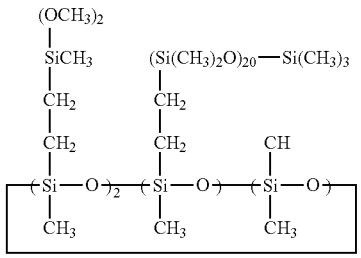

11
-continued
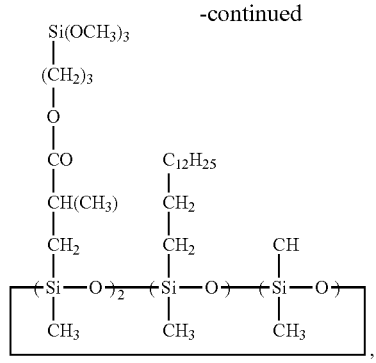
,
12
-continued
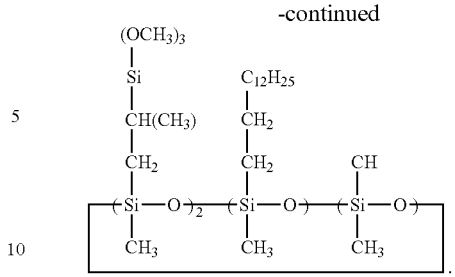
.
As further preferred examples of the siloxane compounds, there can be mentioned compounds represented by the structural formulae shown below.
[Chemical formula 10]
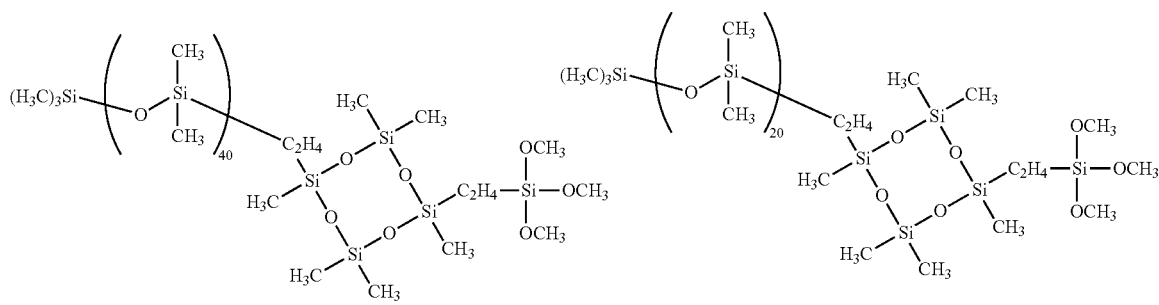
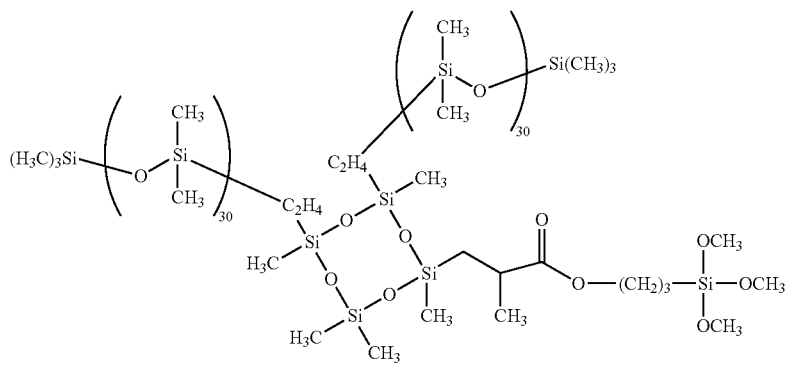
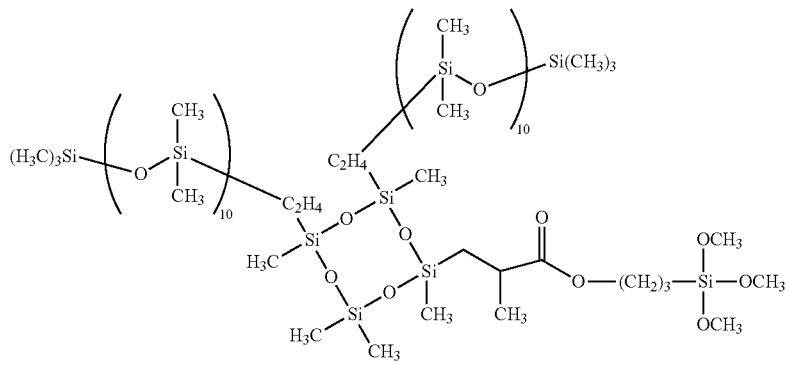

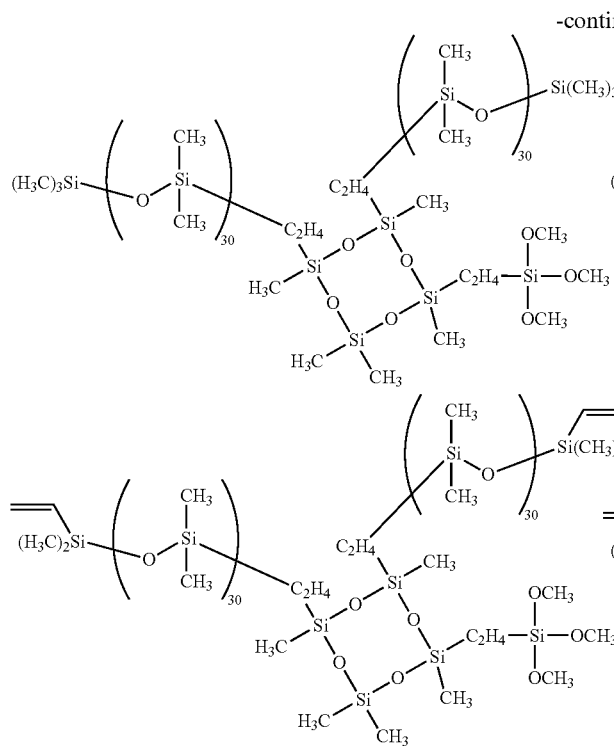
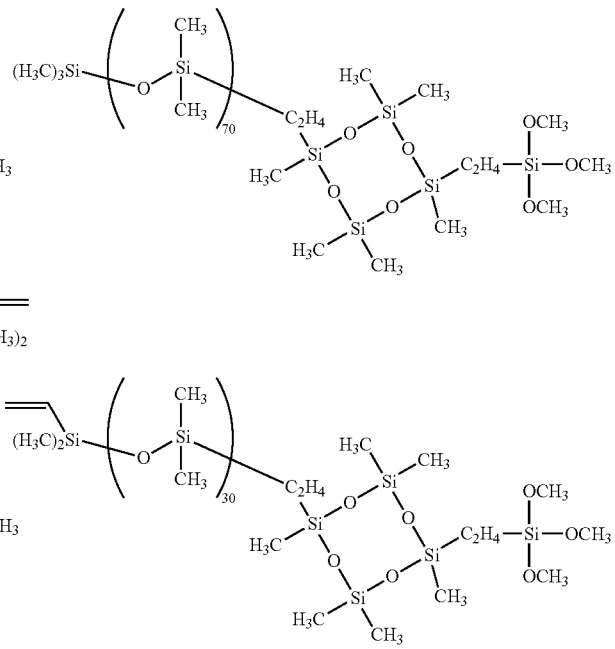

In the description of the structure of the siloxane compound, the structural units of the siloxane compound are frequently indicated using the abbreviations shown below (hereinafter, these structural units are frequently respectively referred to as, for example, "M unit" and "D unit").

M: —Si(CH$_3$)$_3$O$_{1/2}$
M$^H$: —SiH(CH$_3$)$_2$O$_{1/2}$
M$^{Vi}$: —Si(CH=CH$_2$)(CH$_3$)$_2$O$_{1/2}$
D: Si(CH$_3$)$_2$O$_{2/2}$
D$^H$: SiH(CH$_3$)O$_{2/2}$
T: Si(CH$_3$)O$_{3/2}$
Q: SiO$_{4/2}$

For example, the structure of the general formula (2) above wherein R$^4$ is a methyl group and Y is a vinyl group is indicated by -D$_n$M$^{Vi}$. In this connection, it is noted that, for example, when a structure is indicated by D$^H{}_{20}$D$_{20}$, it is understood that the indication is not intended to show that 20 D$^H$ units are continuously disposed and then 20 D units are continuously disposed, but shows that the individual units may be arbitrarily arranged.

The amount of the incorporated siloxane compound as a surface treatment agent is in the range of from 0.01 to 20 parts by mass, relative to 100 parts by mass of the thermally conductive filler. When the amount of the siloxane compound is in this range, the thermal conductivity can be increased while improving the filling property of the thermally conductive filler. The amount of the siloxane compound incorporated is more preferably in the range of from 0.1 to 15 parts by mass. Further, 0.01 part by mass or more of the siloxane compound is preferably used, relative to 100 parts by mass of the polysiloxane resin having a curable functional group. When the amount of the siloxane compound relative to the polysiloxane resin is less than 0.01 part by mass, the surface treatment effect for the thermally conductive filler is reduced, making high incorporation difficult. When the amount of the siloxane compound is too large, the mechanical physical properties and heat resistance of the composition after cured are likely to be adversely affected, and therefore the amount of the siloxane compound is more preferably in the range of from 0.1 to 500 parts by mass.

[Polyorganosiloxane Resin]

In the first invention, the thermally conductive polysiloxane composition comprises a polyorganosiloxane resin having at least one siloxane having one curable functional group in the molecule thereof. In the present specification, the term "curable functional group" means a functional group which is capable of taking part in a curing reaction of a resin. Examples of curable functional groups include a vinyl group, (a)an (meth)acryl group, and a hydrogen group directly bonded to silicon. With respect to the mechanism of the curing reaction, there is no particular limitation, and a method generally used in curing a resin, such as an addition reaction or a condensation reaction, can be employed.

The polyorganosiloxane resin comprises at least one polyorganosiloxane having one curable functional group in the molecule thereof. There is not a specific theory, but it is presumed that, by virtue of having a curable functional group only at one position, the polyorganosiloxane is bonded without causing the crosslinked network to be complicated and is unlikely to be free, making it possible to suppress bleeding while reducing the viscosity/hardness of the thermally conductive composition.

With respect to the type of the polyorganosiloxane having one curable functional group in the molecule thereof, there is no particular limitation, and any polyorganosiloxane can be used as long as it has a curable functional group at one position. The position of the curable functional group may be either an end of the molecule or the inside of the molecule. One type of polyorganosiloxane may be individually used, or two or more different types of polyorganosiloxanes may be used in combination. As an example of the polyorganosiloxane having one curable functional group in the molecule thereof, there can be mentioned a linear polyorganosiloxane containing an aliphatic unsaturated group and being represented by the following general formula (3):

[Chemical formula 11]

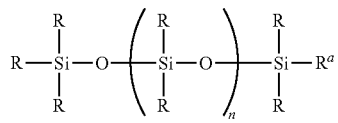
(3)

wherein:
$R^a$ is an aliphatic unsaturated group,
each R is independently a $C_{1-6}$ alkyl group or a $C_{6-12}$ aryl group, and n is the number that satisfies the viscosity of 0.01 to 50 Pa·s at 23° C., but the polyorganosiloxane is not limited to the resin having the above structure. In view of easy availability or preparation, preferred is a polyorganosiloxane of the formula (3) wherein $R^a$ is a vinyl group, that is, a linear polyorganosiloxane having one vinyl group at an end thereof, and a linear siloxane of the formula (3) wherein $R^a$ is a vinyl group and R is methyl is preferably used because of ease of availability.

In the thermally conductive polysiloxane composition, for curing the composition, a polysiloxane resin having two or more curable functional groups as well as the polyorganosiloxane having one curable functional group in the molecule thereof are contained. With respect to the curing mechanism and type of the curable functional group, there is no particular limitation, but preferred is a polysiloxane resin which is curable by an addition reaction. As one mode of the polysiloxane resin having a curable functional group, there can be mentioned a linear polyorganosiloxane containing an aliphatic unsaturated group and being represented by the following general formula (4):

[Chemical formula 12]

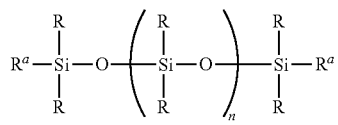
(4)

wherein:
each $R^a$ is independently an aliphatic unsaturated group,
each R is independently a $C_{1-6}$ alkyl group or a $C_2$ aryl group, and n is the number that satisfies the viscosity of 0.01 to 50 Pa·s at 23° C., but the polysiloxane resin is not limited to the resin having the above structure. Of the linear polyorganosiloxanes, a polyorganosiloxane of the formula (4) wherein all R's are methyl and $R^a$ is a vinyl group is preferably used because of ease of availability.

The amount of the incorporated polyorganosiloxane having one curable functional group in the molecule thereof relative to the polyorganosiloxane having a curable functional group in the polysiloxane molecule is preferably in the range of from 20 to 80 parts by mass, more preferably in the range of from 30 to 70 parts by mass. When the amount of the incorporated polyorganosiloxane is in the above range, it is likely that the cured product can be reduced in hardness and bleeding can be more advantageously suppressed.

The amount of the incorporated polyorganosiloxane resin having a curable functional group is, relative to 100 parts by mass of the thermally conductive filler, preferably in the range of from 3 to 30 parts by mass, more preferably in the range of from 3 to 10 parts by mass. Further, the amount of the incorporated polyorganosiloxane having one curable functional group in the molecule thereof is, relative to 100 parts by mass of the thermally conductive filler, preferably in the range of from 3 to 24 parts by mass, more preferably in the range of from 3 to 8 parts by mass. When the amount of the polyorganosiloxane is in the above range, bleeding can be effectively suppressed without sacrificing the high thermal conductivity of the thermally conductive filler.

When the curable functional group is an unsaturated bond, the below-mentioned hydrogen group-containing polyorganosiloxane is added for curing the composition. The amount of the polyorganosiloxane having one curable functional group in the molecule thereof can be also controlled by the mass ratio (H/Vi ratio) of the Si—H bond in the hydrogen group-containing polyorganosiloxane to the unsaturated bond, particularly a vinyl group. The H/Vi ratio is preferably in the range of from 0.2 to 2.0, more preferably in the range of from 0.4 to 1.5. When the H/Vi ratio is 0.2 or more, excessive bleeding can be suppressed. Further, when the H/Vi ratio is 2.0 or less, the composition is cured using a satisfactory amount of the polyorganosiloxane, making it possible to maintain an appropriate hardness.

<<Second Invention>>

In the second invention, an embodiment is a thermally conductive polysiloxane composition which comprises a thermally conductive filler, a specific siloxane compound as a surface treatment agent, and a polyorganosiloxane resin having at least two curable functional groups per molecule.

[Thermally Conductive Filler]

In the second invention, a thermally conductive filler similar to that described above in connection with the first invention can be used.

[Siloxane Compound]

As a surface treatment agent used in the second invention, there is used a siloxane compound represented by the general formula (1):

[Chemical formula 13]

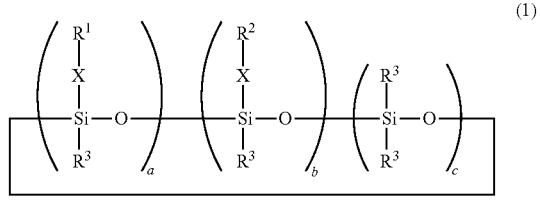
(1)

wherein, in the above formula and the formula (2) included in $R^2$, $R^1$ to $R^4$, Y, X, a, b, c, and a+b+c are as defined above, and d is an integer of 1 to 60, wherein the number of the units represented by —$SiR^4_2O$— per molecule of the siloxane compound represented by the general formula (1) is 10 to 60 in total.

$R^2$ is a group represented by the general formula (2):

[Chemical formula 14]

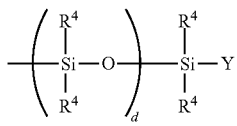
(2)

wherein $R^4$ and Y are as defined above, and d is an integer of 1 to 60.

In the general formula (2), the value of d is in the range of from 1 to 60, preferably in the range of from 4 to 40, more preferably in the range of from 10 to 30. The value of d is designed so that the number of —$SiR^4_2O$— units contained in the siloxane compound represented by the general formula (1) above becomes in the range of from 10 to 60. When the number of the units is in this range, the effect on the fluidity is improved, enabling high incorporation, so that the viscosity of the siloxane compound per se can be reduced, further improving the stability.

a is an integer of 1 or more, preferably 1. b is an integer of 1 or more, preferably 1 or 2, but the value of b is designed in association with the value of d so that the number of —$SiR^4_2O$— units contained in the general formula (2) above becomes in the range of from 1 to 60. For example, b can be designed to be 1 or to be 2 so that d is 10 to 30. c is an integer of 0 or more, preferably 0 to 2. The total of a+b+c is an integer of 4 or more, but is preferably 4 in view of easy synthesis of the compound. Further, when a or b is 2 or more, the structure containing group $R^1$ and the structure containing group $R^2$ contained in the siloxane compound may be different from each other.

As representative examples of the above-mentioned siloxane compounds, there can be mentioned compounds having the structural formulae mentioned above as specific examples, but the composition of the present invention is not limited to those which contain these compounds.

The amount of the incorporated siloxane compound represented by the general formula (1) is in the range of from 0.01 to 20 parts by mass, relative to 100 parts by mass of the thermally conductive filler. When the amount of the siloxane compound is in this range, the thermal conductivity can be increased while improving the filling property of the thermally conductive filler. The amount of the siloxane compound incorporated is more preferably in the range of from 0.1 to 15 parts by mass. Further, 0.01 part by mass or more of the siloxane compound is preferably used, relative to 100 parts by mass of the polysiloxane resin having a curable functional group. When the amount of the siloxane compound relative to the polysiloxane resin is less than 0.01 part by mass, the surface treatment effect for the thermally conductive filler is reduced, making high incorporation difficult. When the amount of the siloxane compound is too large, the mechanical physical properties and heat resistance of the composition after cured are adversely affected, and therefore the amount of the siloxane compound is more preferably in the range of from 0.1 to 500 parts by mass.

[Polyorganosiloxane Resin]

In the second invention, the polyorganosiloxane resin having a curable functional group, which is curable by an addition reaction, is a polyorganosiloxane resin having at least two curable functional groups per molecule. With respect to the structure of the polyorganosiloxane resin, there is no particular limitation as long as the resin satisfies the above-mentioned requirement. As an example of such a polyorganosiloxane resin, there can be mentioned a linear polyorganosiloxane containing an aliphatic unsaturated group at both ends and being represented by the following general formula (3):

[Chemical formula 15]

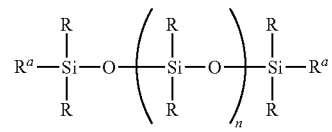
(3)

wherein:
each $R^a$ is independently an aliphatic unsaturated group,
each R is independently a $C_{1-6}$ alkyl group or a $C_{6-12}$ aryl group, and n is the number that satisfies the viscosity of 0.01 to 50 Pa·s at 23° C., but the polyorganosiloxane resin is not limited to the resin having the above structure. Of the linear polyorganosiloxanes, a polyorganosiloxane of the formula (3) wherein all R's are methyl and R is a vinyl group is preferably used because of ease of availability.

The polyorganosiloxane resin having a curable functional group is used in such an amount that the total amount of the polyorganosiloxane resin and the siloxane compound as a surface treatment agent is, relative to 100 parts by mass of the thermally conductive filler, preferably in the range of from 3 to 50 parts by mass, more preferably in the range of from 3 to 40 parts by mass. When the amount of the polyorganosiloxane resin used is in the above range, a uniform thermally conductive polyorganosiloxane composition can be obtained without sacrificing the high thermal conductivity of the thermally conductive filler.

The polyorganosiloxane resin can be classified into an addition-reaction curing type polyorganosiloxane, a condensation-reaction curing type polyorganosiloxane and others according to the curing reaction mechanism. With respect to the polyorganosiloxane classified according to the reaction mechanism, from the viewpoint of the productivity and working properties, an addition-reaction curing type polyorganosiloxane is preferably used. With respect to the addition-reaction curing type polyorganosiloxane, there has been known one which comprises (a) an unsaturated group-containing polyorganosiloxane which is a base polymer, (b) a hydrogen group-containing polyorganosiloxane which is a crosslinking agent, and (c) a platinum compound which is a curing catalyst. In the first invention and the second invention, the polyorganosiloxane resin having an unsaturated group is contained in the composition, and therefore preferred are the thermally conductive polysiloxane composition specified in the first invention or the second invention as one which comprises component (a) as the addition-reaction curing type polyorganosiloxane, and the polyorganosiloxane composition which comprises the above-mentioned components (b) and (c) and optionally further component (a).

With respect to the unsaturated group-containing polyorganosiloxane as component (a), in the organic group bonded to a silicon atom per molecule, at least 0.5 or more unsaturated groups on average are preferably contained. When the number of unsaturated groups per molecule is less than 0.5, the component which does not take part in crosslinking is increased, so that a satisfactory cured product cannot be obtained. When the number of unsaturated groups per molecule is 0.5 or more, a cured product can be obtained basically, but, when the number of unsaturated groups per molecule is too large, the resultant cured product is poor in heat resistance, so that the intended object cannot be achieved. Therefore, the number of unsaturated groups per molecule is preferably in the range of from 0.5 to 2.0. The unsaturated group is preferably a vinyl group from the viewpoint of facilitating preparation of a polyorganosiloxane. The unsaturated group may be bonded to any position of an end of the molecular chain and a side end of the molecular chain, but, from the viewpoint of increasing the curing rate and achieving high heat resistance of the cured product, the unsaturated group is preferably bonded to an end of the molecular chain.

As examples of other functional groups in the unsaturated group-containing polyorganosiloxane, there can be mentioned substituted or unsubstituted monovalent hydrocarbon groups, and examples of such groups include alkyl groups, such as methyl, ethyl, propyl, butyl, hexyl, and dodecyl; aryl groups, such as phenyl; aralkyl groups, such as 2-phenylethyl and 2-phenylpropyl; and substituted hydrocarbon groups, such as chloromethyl and 3,3,3-trifluoropropyl. A methyl group or a phenyl group is preferred in view of easy synthesis of the compound.

The structure of the unsaturated group-containing polyorganosiloxane may be either linear or branched. With respect to the viscosity of the unsaturated group-containing polyorganosiloxane, there is no particular limitation, but the polyorganosiloxane preferably has a viscosity of 0.01 to 50 Pa·s at 23° C.

Generally, an unsaturated group-containing polyorganosiloxane is obtained by subjecting a cyclic siloxane, such as hexamethylcyclotrisiloxane, octamethylcyclotetrasiloxane, or tetravinyltetramethylcyclotetrasiloxane, and an organosiloxane having $R_3SiO_{0.5}$ (wherein R is a monovalent hydrocarbon group) units to equilibrated polymerization in the presence of an appropriate catalyst, such as an alkali or an acid, and then subjecting the resultant product to neutralization step and removing the excess low molecular-weight siloxane component.

The hydrogen group-containing polyorganosiloxane as component (b) is a siloxane compound having a Si—H bond, which is a component that serves as a crosslinking agent. The amount of the incorporated component (b) is an amount such that the number of hydrogen atoms directly bonded to a silicon atom becomes 0.2 to 5.0, relative to one unsaturated group of component (a). When the number of hydrogen atoms is less than 0.2, curing does not satisfactorily proceed, and, when the number of the hydrogen atoms is more than 5.0, the resultant cured product becomes too hard, and further the physical properties of the composition after cured are likely to be adversely affected. It is necessary that the number of hydrogen groups bonded to a silicon atom contained per molecule be at least two or more, but, with respect to the other conditions, organic groups other than a hydrogen group, bonding position, polymerization degree, structure and others, there is no particular limitation, and two or more types of hydrogen group-containing polyorganosiloxanes may be used.

The hydrogen group-containing polyorganosiloxane representatively has in the molecule thereof two or more units represented by the following general formula (4):

$$(R^b)_x(R^c)_y SiO_{(4-x-y)/2} \qquad (4)$$

wherein:
$R^b$ is a hydrogen atom;
$R^c$ is a $C_{1-6}$ alkyl group (for example, methyl, ethyl, propyl, butyl, pentyl, or hexyl, preferably methyl) or a phenyl group;
x is 1 or 2; and
y is an integer of 0 to 2, with the proviso that x+y is 1 to 3.

Examples of siloxane skeletons in the hydrogen group-containing polyorganosiloxane include those which are cyclic, branched, or linear, and preferred is a cyclic or branched skeleton.

The platinum compound as component (c) is a curing catalyst used for reacting an unsaturated group of component (a) with a hydrogen group of component (b) to obtain a cured product. Examples of such platinum compounds include chloroplatinic acid, a platinum-olefin complex, a platinum-vinylsiloxane complex, a platinum-phosphorus complex, a platinum-alcohol complex, and platinum black. The amount of the platinum compound incorporated is 0.1 to 1,000 ppm, in terms of a platinum element, based on the unsaturated group-containing polyorganosiloxane as component (a). When the amount of the platinum compound is less than 0.1 ppm, curing does not satisfactorily proceed, and, even when the amount of the platinum compound is more than 1,000 ppm, an improvement of the curing rate cannot particularly be expected. For obtaining a longer pot life, the activity of the catalyst can be suppressed by adding a reaction inhibitor. Examples of known reaction inhibitors for metals of the platinum group include acetylenic alcohols, such as 2-methyl-3-butyn-2-ol and 1-ethynyl-2-cyclohexanol, and diallyl maleate.

As a method for preparing the composition having incorporated thereinto the thermally conductive filler, the composition may be prepared by mixing together the siloxane compound, the polysiloxane resin having a curable functional group, and the thermally conductive filler using a kneading apparatus, or by first mixing the siloxane compound and the filler to subject the filler to surface treatment, and then dispersing the resultant filler in the polysiloxane resin having a curable functional group. Further, if necessary, the composition may be subjected to treatment by heating, under a reduced pressure, or by another known method. Further, when the composition contains the above-mentioned addition-reaction curing type polyorganosiloxane, a procedure can be performed in which a resin composition having incorporated the above-mentioned component (a) is previously prepared and, immediately before being cured, a mixture of component (b) and component (c) is added to the resin composition.

In the first and second inventions, in the thermally conductive polysiloxane composition, if necessary, a pigment, a flame retardant, a tackifier, a heat resistance imparting agent, a diluent, or an organic solvent and others, which have been known to those skilled in the art, can be appropriately incorporated in such an amount that the effects of the present invention are not sacrificed.

With respect to the thermally conductive polysiloxane composition in the first and second inventions, a silicone rubber can be obtained by curing the curable functional group of the polysiloxane resin. The curing reaction for the polysiloxane composition can be conducted by a method appropriately selected according to the type of the curable functional group of the polysiloxane resin.

When using a polyorganosiloxane having, as a curable functional group, a functional group which causes a curing reaction due to heat, such as an epoxy group, the thermally conductive polysiloxane composition can be cured by applying heat to the composition. The conditions for heat curing are known to those skilled in the art, and, as examples of apparatuses which can be used in a curing reaction caused due to heat, there can be mentioned apparatuses known to those skilled in the art, such as a constant temperature bath. The heating conditions can be appropriately selected according to the heat resistance temperature of a member to which the composition is applied, and the curing time can be determined. For example, heat at 40 to 100° C. can be applied to the composition for a period of time in the range of from 1 minute to 5 hours. The heating temperature is preferably 50 to 90° C. from the viewpoint of the operating properties, more preferably 60 to 80° C. The heating time is preferably 5 minutes to 3 hours from the viewpoint of facilitating the curing step, more preferably 10 minutes to 2 hours.

<<Third Invention>>

An embodiment of the present invention is a thermally conductive silicone grease which substantially comprises a thermally conductive filler, a siloxane compound as a surface treatment agent, and a polysiloxane resin.

[Thermally Conductive Filler]

In the third invention, a thermally conductive filler similar to that described above in connection with the first invention can be used.

[Polyorganosiloxane Resin]

In the third invention, the thermally conductive silicone grease contains a polyorganosiloxane resin as a base for the grease. With respect to the structure of the polyorganosiloxane resin, there is no particular limitation as long as the polyorganosiloxane resin is used as a base for a grease, and, for example, a linear, branched, or cyclic polyorganosiloxane resin can be used. Alternatively, a modified silicone having a functional group introduced can be used. For example, for the purpose of changing the hardness of a grease, the polyorganosiloxane resin may have a curable functional group that serves as a reactive site for a curing reaction. For example, the polyorganosiloxane resin described above in connection with the first invention and the second invention can be used.

[Siloxane Compound]

In the thermally conductive silicone grease in the third invention, as a surface treatment agent, there is used a siloxane compound represented by the following general formula (1):

[Chemical formula 16]

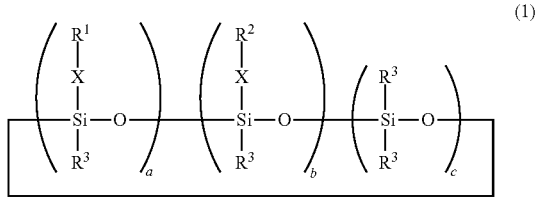

(1)

wherein, in the above formula and the formula (2) included in $R^2$, $R^1$ to $R^4$, Y, X, a, b, c, and a+b+c are as defined above, and d is an integer of 1 to 100, wherein the number of the units represented by —SiR$^4$$_2$O— per molecule of the siloxane compound represented by the general formula (1) is 1 to 150 in total.

The thermally conductive silicone grease in the third invention substantially comprises the above-mentioned three components. The wording 'the thermally conductive silicone grease "substantially comprises" the three components' does not exclude the addition of a conventionally known additive to the grease, and, if necessary, an additive known to those skilled in the art, such as a pigment, a flame retardant, a tackifier, a heat resistance imparting agent, a diluent, or an organic solvent, can be appropriately incorporated into the grease in such an amount that the effects of the present invention are not sacrificed.

A silicone rubber obtained by curing the thermally conductive polysiloxane composition of the present invention or the silicone grease can be used as a radiator member for electronic devices and electronic parts, such as an integrated circuit element.

EXAMPLES

Hereinbelow, the present invention will be described with reference to the following Examples, which should not be construed as limiting the scope of the present invention. In the following Examples and Comparative Examples, the "part(s)" indicates part(s) by mass.

The materials used in the following Examples and Comparative Examples are shown below.

<Thermally Conductive Filler>

Rounded-shape alumina having an average particle diameter of 0.4 μm (Sumicorundum AA-04, manufactured by Sumitomo Chemical Co., Ltd.)

Spherical-shape aluminum nitride having an average particle diameter of 5 μm (HF-05, manufactured by Tokuyama Corporation)

Indefinite-shape aluminum nitride having an average particle diameter of 100 μm (TFZ-N100P, manufactured by Toyo Aluminum K.K.)

<Polyorganosiloxane Resin>

α,ω-Divinylpolydimethylsiloxane; viscosity: 0.35 Pa·s

α,ω-Divinylpolydimethylsiloxane; viscosity: 0.03 Pa's

α-Vinylpolydimethylsiloxane; viscosity 0.35 Pa·s

α-Vinylpolydimethylsiloxane; siloxane having a composition represented by MD$_{30}$M$^{Vi}$; viscosity: 0.03 Pa·s <Surface Treatment Agent: Siloxane Compound Represented by the General Formula (1)>

Siloxanes represented by the chemical formulae (A-1) to (A-3) below were used in the Examples and Comparative Examples.

[Chemical formula 17]

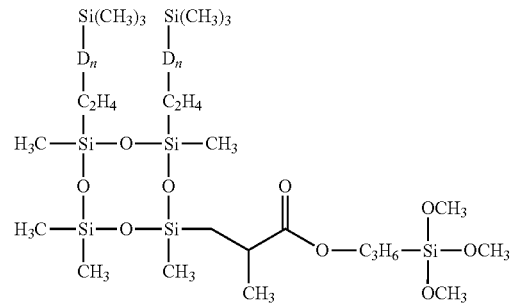

(A-1)

-continued

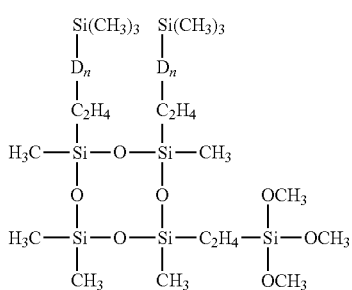

(A-2)

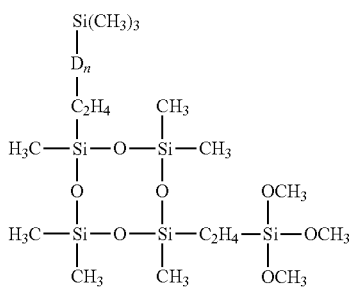

(A-3)

Wherein D represents a —Si(CH$_3$)$_2$O$_{2/2}$— unit (D unit), and n represents the number of D units.

The types of the siloxane compounds used in Examples and Comparative Examples and the numbers of the dimethylsilyloxy groups (D units) in the siloxane compounds are shown in Table 1. In the following description, the term "polymerization number" means a total number of D units contained in the siloxane compound. In this connection, it is noted that the limitation of the polymerization number of the siloxane compound used in the cured product of the thermally conductive silicone resin composition (first and second inventions) is different from that of the siloxane compound used in the thermally conductive silicone grease.

TABLE 1

| Chemical formula | n | Polymerization number | Example | Comparative Example |
|---|---|---|---|---|
| A-1 | 10 | 20 | 8, 20 | |
| A-2 | 30 | 60 | 9, 21 | |
| A-1 | 30 | 60 | 10, 22, 23 | |
| A-3 | 10 | 10 | 11, 24 | |
| A-3 | 20 | 20 | 1-7, 12-16, 25, 26 | 1-6 |
| A-3 | 30 | 30 | 17-18 | |
| A-3 | 40 | 40 | 19, 27 | |
| A-3 | 70 | 70 | 28 | 7 |
| A-3 | 70 | 140 | 29 | 8 |
| A-1 | 100 | 200 | | 9, 11 |
| A-3 | 200 | 200 | | 10, 12 |

<<Curing Composition>>
<Unsaturated Group-Containing Polyorganosiloxane>
α,ω-Divinylpolydimethylsiloxane; viscosity 0.35 Pa·s
<Hydrogen Group-Containing Polyorganosiloxane>
Methylhydrogenpolysiloxane represented by M$^H$D$^H_3$D$_{22}$M$^H$; viscosity: 0.02 Pa·s
Methylhydrogenpolysiloxane represented by MD$^H_{20}$D$_{20}$M; viscosity: 0.03 Pa·s
Methylhydrogenpolysiloxane represented by M$^H$D$_{20}$M$^H$; viscosity: 0.02 Pa·s
<Platinum Catalyst>
Pt-D$^{Vi}_4$ complex (tetravinyltetramethylcyclotetrasiloxane complex of platinum)

Pt-M$^{Vi}$M$^{Vi}$ complex (1,2-divinyltetramethyldisiloxane complex of platinum)
<Reaction Inhibitor>
Diallyl maleate (manufactured by Tokyo Chemical Industry Co., Ltd.)

Examples 1 to 7 and Comparative Examples 1 to 6

Surface Treatment (1) of Alumina with a Siloxane Compound

Predetermined amounts of a polyorganosiloxane resin and, if necessary, a silicone oil, 2 parts by mass of a siloxane compound having a polymerization number of 20 and being represented by (A-3) above as a surface treatment agent, and, as a 20 thermally conductive filler, 19.31 parts by mass of rounded-shape alumina having an average particle diameter of 0.4 μm (Sumicorundum AA-04, manufactured by Sumitomo Chemical Co., Ltd.), 32 parts by mass of spherical-shape aluminum nitride having an average particle diameter of 5 μm (HF-05, manufactured by Tokuyama Corporation), and 52 parts by mass of indefinite-shape aluminum nitride having an average particle diameter of 100 μm (TFZ-N100P, manufactured by Toyo Aluminum K.K.) were kneaded by a predetermined method using a planetary mixer to obtain a thermally conductive polysiloxane composition having a surface-treated inorganic filler.

Then, to the obtained thermally conductive polysiloxane composition was added the above-mentioned platinum-vinylsiloxane complex catalyst (Pt-D$^{Vi}_4$ complex) as a platinum catalyst in such an amount that the catalyst concentration became 2.5 ppm in terms of a platinum atom, and the resultant mixture was kneaded by a predetermined method using a planetary mixer. Further, a predetermined amount of the hydrogen group-containing polymethylsiloxane was mixed and the resultant mixture was kneaded by a predetermined method using a planetary mixer, obtaining thermally conductive polysiloxane compositions in Examples 1 to 7 and Comparative Examples 1 to 6. With respect to the obtained compositions, a viscosity at 23° C. was measured at 2 rpm for 5 minutes in accordance with JIS K6249 using a rotational viscometer (Vismetron VDH) (manufactured by Shibaura System Co., Ltd.) and using a No. 7 rotor. The results of the measurement of viscosity are shown in Table 2.

Separately, the thermally conductive polysiloxane composition was poured into a mold being made of aluminum coated with Teflon (registered trademark) and having an internal dimension of 6 mm (depth)×60 mm (length)×30 mm (width) and cured using a hot-air circulating dryer at 150° C. for one hour. The cured product was cooled to 23° C., and then a Type E hardness was measured in accordance with JIS K6249. Further, a thermal conductivity of the cured product was measured using TPS 1500 (manufactured by Kyoto Electronics Manufacturing Co., Ltd.). The results are shown in Table 2 below.

(1) Measurement of Bleeding

The thermally conductive polysiloxane compositions in Examples 1 to 7 and Comparative Examples 1 to 6, which were cured under curing conditions at 150° C. for one hour using a mold being made of aluminum coated with Teflon (registered trademark) and having an internal dimension of 6 mm (depth)×30 mm (length)×30 mm (width), were individually placed on filter paper in an environment at 23° C. and at a relative humidity of 50% and a load of 530 g was applied to the cured composition in that state for one week to measure a bleeding amount. A change in mass of the filter paper after the one-week test from the filter paper before the test was determined as an amount of the oil component absorbed by the filter paper, i.e., a bleeding amount. The results are shown in Table 2 below.

(2) Thermal Conductivity

Using a thermal conductivity meter (TPS 1500) (manufactured by Kyoto Electronics Manufacturing Co., Ltd.), a thermal conductivity was measured by disposing the sensor of the thermal conductivity meter between two samples which were prepared under curing conditions at 150° C. for one hour using a mold being made of aluminum coated with Teflon (registered trademark) and having an internal dimension of 6 mm (depth)×30 mm (length)×30 mm (width). The unit of a thermal conductivity is W/mK.

From Table 2, it is apparent that, by using the siloxane compound having a curable functional group at one position of the molecular ends thereof and mixing it into a polysiloxane resin, there can be obtained a composition which has a viscosity such that the composition can be handled, and which is unlikely to cause bleeding and maintains an appropriate hardness and thermal conductivity (Examples 1 to 7), as compared to the compositions in Comparative Examples 1 to 6 in which the above siloxane is not used. Further, it is apparent that the thermally conductive polysiloxane composition in Example suppresses the bleeding amount, as compared to the composition which has a similar hardness, and which does not use the siloxane compound having a curable functional group at one position of the molecular ends thereof (for example, Example 7 and Comparative Example 6). The composition having incorporated an oil conventionally used is lowered in the thermal conductivity and likely to cause bleeding, as compared to the composition having a similar formulation (Example 2 and Comparative Example 3), which indicates that the use of the polysiloxane resin having one unsaturated group is important for suppressing the occurrence of bleeding.

TABLE 2

| | | Example | | | | | | |
|---|---|---|---|---|---|---|---|---|
| | | 1 | 2 | 3 | 4 | 5 | 6 | 7 |
| Thermally conductive filler | TFZ-N100P (Aluminum nitride 100 μm) | 52 | 52 | 52 | 52 | 52 | 52 | 52 |
| | HF-05 (Aluminum nitride 5 μm) | 32 | 32 | 32 | 32 | 32 | 32 | 32 |
| | AA-04 (Spherical-shape alumina 0.4 μm) | 19.31 | 19.31 | 19.31 | 19.31 | 19.31 | 19.31 | 19.31 |
| Surface treatment agent | W-1 | 2 | 2 | 2 | 2 | 2 | 2 | 2 |
| Polysiloxane resin | Viscosity 0.03 Pas $M^{Vi}D_nM^{Vi}$ | 1.11 | 1.21 | 2.67 | 1.84 | 1.24 | 0.95 | 1.30 |
| | $MD_{30}M^{Vi}$ | 2.22 | 2.42 | 0.89 | 1.84 | 2.52 | 2.85 | 2.60 |
| Hydrogen-polysiloxane | $M^HD^H_3D_{22}M^H$ | 1.07 | 0.78 | 0.84 | 0.72 | 0.64 | 0.60 | 0.50 |
| H/Vi Ratio | | 1.5 | 1.0 | 0.8 | 0.8 | 0.8 | 0.8 | 0.6 |
| Platinum catalyst | $Pt-D^{Vi}_4$ | 2.5 ppm | 2.5 ppm | 2.5 ppm | 2.5 ppm | 2.5 ppm | 2.5 ppm | 2.5 ppm |
| Additive | TSF451-20 (Dimethyl oil having a viscosity of 0.02 Pa·s) | | | | | | | |
| Viscosity(No. 7 × 2 rpm) | | 550 | 534 | 702 | 597 | 638 | 896 | 6.74 |
| Bleeding(g) | | 0.0010 | 0.0012 | 0.0019 | 0.0067 | 0.0148 | 0.0228 | 0.0420 |
| Type E hardness | | 95 | 93 | 90 | 87 | 73 | 67 | 45 |
| Thermal conductivity | | 12.1 | 11.9 | 12.0 | 12.0 | 12.1 | 11.9 | 11.6 |

| | | Comparative Example | | | | | |
|---|---|---|---|---|---|---|---|
| | | 1 | 2 | 3 | 4 | 5 | 6 |
| Thermally conductive filler | TFZ-N100P (Aluminum nitride 100 μm) | 52 | 52 | 52 | 52 | 52 | 52 |
| | HF-05 (Aluminum nitride 5 μm) | 32 | 32 | 32 | 32 | 32 | 32 |
| | AA-04 (Spherical-shape alumina 0.4 μm) | 19.31 | 19.31 | 19.31 | 19.31 | 19.31 | 19.31 |
| Surface treatment agent | W-1 | 2 | 2 | 2 | 2 | 2 | 2 |
| Polysiloxane resin | Viscosity 0.03 Pas $M^{Vi}D_nM^{Vi}$ | 3.28 | 2.46 | 1.64 | 1.23 | 1.09 | 0.96 |
| | $MD_{30}M^{Vi}$ | | | | | | |
| Hydrogen-polysiloxane | $M^HD_3D_{22}M^H$ | 1.12 | 0.84 | 0.56 | 0.42 | 0.37 | 0.33 |
| H/Vi Ratio | | 1.0 | 1.0 | 1.0 | 1.0 | 1.0 | 1.0 |
| Platinum catalyst | $Pt-D^{vi}_4$ | 2.5 ppm | 2.5 ppm | 2.5 ppm | 2.5 ppm | 2.5 ppm | 2.6 ppm |
| Additive | TSF451-20 (Dimethyl oil having a viscosity of 0.02 Pa·s) | | 1.10 | 2.20 | 2.75 | 2.93 | 3.30 |
| Viscosity(No.7 × 2 rpm) | | 650 | 642 | 644 | 620 | 590 | 560 |
| Bleeding(g) | | 0.0020 | 0.0022 | 0.0074 | 0.0184 | 0.0383 | 0.0510 |
| Type E hardness | | 95 | 89 | 87 | 80 | 70 | 48 |
| Thermal conductivity | | 12.7 | 12.1 | 11.8 | 11.7 | 11.5 | 11.0 |

Examples 8 to 19 and Comparative Examples 7 to 10

Surface Treatment (2) of Alumina with a Siloxane Compound

Formulation Example A

A predetermined amount of each of the siloxane compounds corresponding to Examples 8 to 19 and Comparative Examples 5 to 8 as the siloxane compound represented by the general formula (1), a predetermined amount of α,ω-divinylpolydimethylsiloxane or α-vinylpolydimethylsiloxane (each having a viscosity of 0.35 Pa·s) as the polyorganosiloxane resin, and 100 parts by mass of Sumicorundum AA-04 as alumina were kneaded by a predetermined method using a planetary mixer to obtain thermally conductive polysiloxane composition A having surface-treated alumina. With respect to the obtained composition A, a viscosity at 23° C. was measured at 10 rpm for one minute in accordance with JIS K6249 using a rotational viscometer (Vismetron VDH) (manufactured by Shibaura System Co., Ltd.) and using a No. 7 rotor. The formulations of components in Examples and Comparative Examples and the results of the measurement of viscosity are shown in Table 3.

Formulation Example B

To 66.65 parts by weight of thermally conductive polysiloxane composition A 20 prepared in Formulation Example A were added 4.5 parts by mass of α,ω-divinylpolydimethylsiloxane (viscosity: 0.35 Pa·s) as the unsaturated group-containing polyorganosiloxane and the above-mentioned platinum-vinylsiloxane complex (Pt-$M^{Vi}M^{Vi}$ complex) in such an amount that the catalyst concentration became 2 ppm in terms of a platinum atom. Separately, to 66.65 parts by weight of the remaining thermally conductive polysiloxane composition A were added 0.7 part by mass of $MD^H{}_{20}D_{20}M$ and 1.06 parts by mass of $M^H D_{20} M^H$ as the hydrogen group-containing polymethylsiloxane and 0.002 part by mass of diallyl maleate as a reaction inhibitor. The resultant mixtures were individually kneaded by a predetermined method using a planetary mixer to obtain thermally conductive polysiloxane compositions B-1 and B-2. The obtained compositions B-1 and B-2 were mixed in a predetermined ratio, and the resultant mixture was uniformly stirred and then poured into a mold being made of aluminum coated with Teflon (registered trademark) and having an internal dimension of 6 mm (depth)×60 mm (length)×30 mm (width) and cured using a hot-air circulating dryer at 70° C. for 30 minutes. The cured product was cooled to 23° C., and then a Type E hardness was measured in accordance with JIS K6249. Further, a thermal conductivity of the cured product was measured using TPS 1500 (manufactured by Kyoto Electronics Manufacturing Co., Ltd.) in the same manner as in Example 1. Separately, polysiloxane compositions B-1 and B-2 were placed in an environment at 70° C. for 3 days, and cooled to 23° C., and then the polysiloxane compositions B-1 and B-2 were mixed in a predetermined ratio, and the resultant mixture was uniformly stirred and then poured into a mold being made of aluminum coated with Teflon (registered trademark) and having an internal dimension of 6 mm (depth)×60 mm (length)×30 mm (width) and cured using a hot-air circulating dryer at 70° C. for 30 minutes. The cured product was cooled to 23° C., and then a Type E hardness was measured in accordance with JIS K6249. The results are shown in Table 3 below.

TABLE 3

| | | | | | | Example | | | | | |
|---|---|---|---|---|---|---|---|---|---|---|---|
| | | | | | | 8 | 9 | 10 | 11 | 12 | 13 |
| Thermally conductive filler | Sumicorundum AA-04 | | | | | 100 | 100 | 100 | 100 | 100 | 100 |
| Polyorganosiloxane resin | Viscosity 0.35 Pas $M^{Vi}D_nM^{Vi}$ | | | | | 33.3 | 33.3 | 33.3 | 33.3 | 33.3 | 20.90 |
| | Viscosity 0.35 Pas $MD_nM^{Vi}$ | | | | | | | | | | 12.70 |
| | | Chemical formula | n | Polymerization number | Viscosity (cP) | | | | | | |
| Surface treatment agent | | A-1 | 100 | 200 | 400 | | | | | | |
| | | A-1 | 70 | 140 | 190 | | | | | | |
| | | A-1 | 30 | 60 | 90 | | | | 1 | | |
| | | A-2 | 30 | 60 | 80 | | 1 | | | | |
| | | A-1 | 10 | 20 | 40 | 1 | | | | | |
| | | A-3 | 200 | 200 | 380 | | | | | | |
| | | A-3 | 70 | 70 | 115 | | | | | | |
| | | A-3 | 40 | 40 | 64 | | | | | | |
| | | A-3 | 30 | 30 | 40 | | | | | | |
| | | A-3 | 20 | 20 | 38 | | | | | | 1 |
| | | A-3 | 10 | 10 | 25 | | | | | 1 | |
| Viscosity before cured | Viscosity No.7 × 10 rpm | | | | | 45 | 68 | 70 | 95 | 55 | 58 |
| Polyorganosiloxane resin | Viscosity 0.35 Pas $M^{Vi}D_nM^{Vi}$ | | | | | 4.5 | 4.5 | 4.5 | 4.5 | 4.5 | 4.50 |
| Platinum catalyst | Pt-$M^{Vi}M^{Vi}$ | | | | | 2 ppm | 2 ppm | 2 ppm | 2 ppm | 2 ppm | 2 ppm |
| Organohydrogen-polysiloxane | $MD^H{}_{20}D_{20}M$ | | | | | 0.7 | 0.7 | 0.7 | 0.7 | 0.7 | 0.57 |
| | $M^H D_{20} M^H$ | | | | | 1.06 | 1.06 | 1.06 | 1.06 | 1.06 | 0.90 |
| Reaction inhibitor | Diallyl maleate | | | | | 0.002 | 0.002 | 0.002 | 0.002 | 0.002 | 0.00 |
| Hardness (Type E) 100° C., 30 min. | initial | | | | | 54 | 50 | 50 | 50 | 51 | 52 |
| | After accelerated test at 70° C. for 3 days | | | | | 57 | 54 | 55 | 53 | 51 | 54 |
| | Change of hardness | | | | | 3 | 4 | 5 | 3 | 0 | 2 |
| Thermal conductivity (W/mK) | | | | | | 0.99 | | | 0.99 | | 1.00 |

TABLE 3-continued

|  |  | Example |  |  |  |  |  | Comparative Example |  |  |  |
|---|---|---|---|---|---|---|---|---|---|---|---|
|  |  | 14 | 15 | 16 | 17 | 18 | 19 | 7 | 8 | 9 | 10 |
| Thermally conductive filter |  | 100 | 100 | 100 | 100 | 100 | 100 | 100 | 100 | 100 | 100 |
| Polyorganosiloxane resin |  | 14.62 19.13 | 8.30 25.60 | 34.1 | 33.3 | 34.05 | 33.3 | 33.3 | 33.3 | 33.3 | 33.3 |
| Surface treatment agent |  |  |  |  |  |  |  |  |  | 1 |  |
|  |  |  |  |  |  |  |  |  | 1 |  |  |
|  |  |  |  |  |  |  |  |  |  |  | 1 |
|  |  |  |  |  |  |  |  | 1 |  |  |  |
|  |  |  |  |  |  |  | 1 |  |  |  |  |
|  |  |  |  |  | 1 | 0.25 |  |  |  |  |  |
|  |  | 1 | 1 | 0.2 |  |  |  |  |  |  |  |
| Viscosity before cured |  | 60 | 64 | 100 | 75 | 95 | 80 | 90 | 104 | 178 | 185 |
| Polyorganosiloxane resin |  | 4.50 | 4.50 | 4.5 | 4.5 | 4.5 | 4.5 | 4.5 | 4.5 | 4.5 | 4.5 |
| Platinum catalyst |  | 2 ppm | 2 ppm | 2 ppm | 2 ppm | 2 ppm | 2 ppm | 2 ppm | 2 ppm | 2 ppm | 2 ppm |
| Organohydrogen-polysiloxane |  | 0.52 0.80 | 0.47 0.70 | 0.7 1.06 | 0.7 1.06 | 0.7 1.06 | 0.7 1.06 | 0.7 1.06 | 0.7 1.06 | 0.7 1.06 | 0.7 1.06 |
| Reaction inhibitor |  | 0.00 | 0.00 | 0.002 | 0.002 | 0.002 | 0.002 | 0.002 | 0.002 | 0.002 | 0.002 |
| Hardness (Type E) |  | 52 | 54 | 47 | 49 | 45 | 50 | 39 | 41 | 40 | 39 |
| 100° C., 30 min. |  | 51 ▲1 | 55 1 | 46 ▲1 | 51 2 | 44 ▲1 | 55 5 | 30 ▲9 | 30 ▲11 | 23 ▲17 | 24 ▲15 |
| Thermal conductivity (W/mK) |  | 1.01 | 0.99 |  |  |  | 0.98 |  |  | 0.95 |  |

From Table 3, it is apparent that, by using as a surface treatment agent the siloxane compound having a siloxane chain structure having an appropriate length obtained by selecting the polymerization number in a predetermined range, there can be obtained a composition which has a viscosity such that the composition can be handled, and which has excellent stability such that almost no change is found in the hardness after an accelerated test. Further, the results have shown that this property is exhibited irrespective of the type of the polyorganosiloxane resin (Examples 13 to 15). On the other hand, when using the siloxane compound in which the polymerization number for D units is more than 60, the composition was lowered in hardness with the passage of time, and thus had a problem about the stability.

Examples 20 to 29 and Comparative Examples 11 to 13

Surface Treatment (3) of Alumina with a Siloxane Compound: Preparation of a Grease Formulation Example A A predetermined amount of each of the siloxane compounds corresponding to Examples 20 to 28 and Comparative Examples 9 to 11 as the siloxane compound represented by the general formula (1), a predetermined amount of α,ω-divinylpolydimethylsiloxane (viscosity: 0.35 Pa·s) as the polyorganosiloxane resin, and 100 parts by mass of Sumicorundum AA-04 as alumina were kneaded by a predetermined method using a planetary mixer to obtain thermally conductive polysiloxane composition A having surface-treated alumina. In Comparative Example 3, the siloxane compound as a surface treatment agent was not used. With respect to the obtained composition A, a viscosity at 23° C. was measured at 10 rpm for one minute in accordance with JIS K6249 using a rotational viscometer (Vismetron VDH) (manufactured by Shibaura System Co., Ltd.) and using a No. 7 rotor. The formulations of components in Examples and Comparative Examples and the results of the measurement of viscosity are shown in Table 4.

TABLE 4

|  |  |  |  |  | Example |  |  |  |  |  |  |
|---|---|---|---|---|---|---|---|---|---|---|---|
|  |  |  |  |  | 20 | 21 | 22 | 23 | 24 | 25 | 26 |
| Thermally conductive filter | Sumicorundum AA-04 |  |  |  | 100 | 100 | 100 | 100 | 100 | 100 | 100 |
| Polyorganosiloxane resin | Viscosity 0.35 Pas $M^{Vi}D_nM^{Vi}$ |  |  |  | 33.3 | 33.3 | 33.3 | 33.8 | 33.3 | 33.3 | 34.1 |
|  |  | Chemical formula | n | Polymerization number | Viscosity (cP) |  |  |  |  |  |  |
| Surface treatment agent |  | A-1 | 100 | 200 | 400 |  |  |  |  |  |  |
|  |  | A-1 | 70 | 140 | 190 |  |  |  |  |  |  |
|  |  | A-1 | 30 | 60 | 90 |  |  |  |  |  | 1 | 0.5 |

TABLE 4-continued

| | | | | | Ex | | | | |
|---|---|---|---|---|---|---|---|---|---|
| A-2 | 30 | 60 | 80 | | 1 | | | | |
| A-1 | 10 | 20 | 40 | 1 | | | | | |
| A-3 | 200 | 200 | 380 | | | | | | |
| A-3 | 70 | 70 | 115 | | | | | | |
| A-3 | 40 | 40 | 64 | | | | | | |
| A-3 | 20 | 20 | 38 | | | | | 1 | 0.2 |
| A-3 | 10 | 10 | 25 | | | | 1 | | |
| Composition viscosity | Viscosity No. 7 × 10 rpm | | | 45 | 68 | 70 | 105 | 95 | 55 | 100 |

| | | | | | Example | | | Comparative Example | | |
|---|---|---|---|---|---|---|---|---|---|---|
| | | | | | 27 | 26 | 29 | 11 | 122 | 13 |
| Thermally conductive filler | Sumicorundum AA-04 | | | | 100 | 100 | 100 | 100 | 100 | 100 |
| Polyorgenosiloxane resin | Viscosity 0.35 Pas $M^{Vi}D_nM^{Vi}$ | | | | 33.3 | 33.3 | 33.3 | 33.3 | 33.3 | 34.3 |
| | Chemical formula | n | Polymerization number | Viscosity (cP) | | | | | | |
| Surface treatment agent | A-1 | 100 | 200 | 400 | | | | 1 | | |
| | A-1 | 70 | 140 | 190 | | | 1 | | | |
| | A-1 | 30 | 60 | 90 | | | | | | |
| | A-2 | 30 | 60 | 80 | | | | | | |
| | A-1 | 1 | 20 | 40 | | | | | 1 | |
| | A-3 | 200 | 200 | 380 | | | | | | |
| | A-3 | 70 | 70 | 115 | | 1 | | | | |
| | A-3 | 40 | 40 | 64 | 1 | | | | | |
| | A-3 | 20 | 20 | 38 | | | | | | |
| | A-3 | 10 | 10 | 25 | | | | | | |
| Composition viscosity | Viscosity No. 7 × 10 rpm | | | | 80 | 90 | 104 | 178 | 185 | 202 |

From Table 4, it is apparent that, by using the siloxane compound having a linear siloxane structure having an appropriate length, there can be obtained a composition which is markedly lowered in viscosity to have excellent handling properties, as compared to the composition using no surface treatment agent (Comparative Example 11). On the other hand, when using the siloxane compound having along linear siloxane structure, a uniform composition was obtained, but the obtained composition had a viscosity which is not lower than that of the composition using no surface treatment agent, and was not satisfactory in view of the handling properties (Comparative Examples 9 and 10).

INDUSTRIAL APPLICABILITY

The thermally conductive polysiloxane composition of the present invention is advantageous in that the obtained composition has high fluidity such that excellent handling properties are achieved, and further has excellent stability such that the occurrence of bleeding is suppressed. Further, the thermally conductive silicone grease of the present invention has incorporated a thermally conductive filler at high ratio and therefore exhibits high thermal conductivity. Furthermore, the composition having incorporated a thermally conductive filler is not lowered in fluidity, and has imparted thereto excellent processability and heat resistance. Therefore, the thermally conductive polysiloxane composition and silicone grease can be widely effectively used as a radiator member for various electronic devices and electronic parts, such as an integrated circuit element.

The invention claimed is:

1. A thermally conductive polysiloxane composition comprising:
   (A) a thermally conductive filler;
   (B) a polyorganosiloxane resin comprising at least one polysiloxane having only one vinyl group in the molecule thereof and at least one polysiloxane having at least two vinyl groups in the molecule thereof, wherein a content of the polysiloxane having one vinyl group in the molecule thereof is in a range of 20% to 80% by mass relative to a total amount of the at least one polysiloxane having only one vinyl group in the molecule thereof and the at least one polysiloxane having at least two vinyl groups in the molecule thereof;
   (C) a siloxane compound;
   (D) an organohydrogenpolysiloxane having a hydrogen atom bonded to a silicon atom; and
   (E) a platinum catalyst,
   wherein the siloxane compound (C) is a siloxane compound represented by the following formula (A-3):

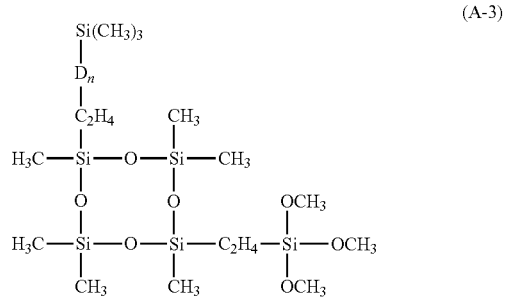

(A-3)

wherein D represents a $-Si(CH_3)_2O_{2/2}-$ unit, and n represents an integer of 1 to 60.

2. The thermally conductive polysiloxane composition according to claim 1, wherein the polysiloxane having one vinyl group in the molecule thereof is a linear polyorganosiloxane having one vinyl group at an end thereof.

3. A thermally conductive polysiloxane composition comprising:
(A) a thermally conductive filler;
(B') a polyorganosiloxane resin having at least two vinyl groups per molecule; and
(C) a siloxane compound;
(D) an organohydrogenpolysiloxane having a hydrogen atom bonded to a silicon atom; and
(E) a platinum catalyst,
wherein the siloxane compound (C) is a siloxane compound represented by the following formula (A-3):

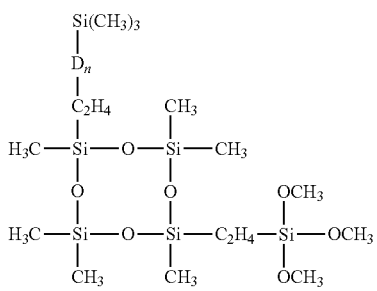

wherein D represents a —Si(CH$_3$)$_2$O$_{2/2}$— unit, and n represents an integer of 1 to 60.

4. The thermally conductive polysiloxane composition according to claim 1, which is of an addition-reaction curing type.

5. A thermally conductive polysiloxane composition comprising the thermally conductive polysiloxane composition according to claim 1, which is of an addition-reaction curing type, wherein a mass ratio of the hydrogen directly bonded to silicon to the vinyl group contained in the composition (H/Vi ratio) is in a range of 0.2 to 2.0.

6. A thermally conductive silicone grease substantially comprising:
a thermally conductive filler consisting of alumina;
a polyorganosiloxane resin; and
a siloxane compound represented by the following general formula (1):

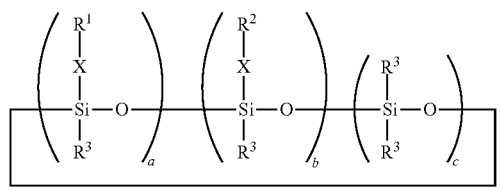

wherein:
R$^1$ is a group having an alkoxysilyl group having 1 to 4 carbon atoms; and
R$^2$ is a linear organosiloxy group represented by the following general formula (2):

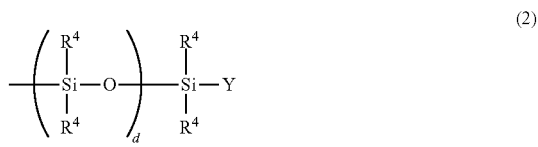

wherein each R$^4$ is independently a monovalent hydrocarbon group having 1 to 12 carbon atoms, and Y is a group selected from the group consisting of methyl, vinyl, and R$^1$;
each X is independently a divalent hydrocarbon group having 2 to 10 carbon atoms;
a is an integer of 1 or more;
b is an integer of 1 or more;
c is an integer of 0 or more;
a+b+c is an integer of 4 or more;
each R$^3$ is independently a monovalent hydrocarbon group having 1 to 6 carbon atoms, or a hydrogen atom; and
d is an integer of 1 to 100,
wherein the number of the units represented by —SiR$^4$$_2$O— per molecule of the siloxane compound represented by the general formula (1) is 1 to 150 in total, and
wherein an amount of the siloxane compound with respect to an amount of the thermally conductive filler is 1 part by mass or less of the siloxane compound to 100 parts by mass of the thermally conductive filler.

7. The thermally conductive silicone grease according to claim 6, wherein, in the general formula (1), b is 2.

8. The thermally conductive silicone grease according to claim 6, wherein, in the general formula (1), b is 1, and, in the general formula (2), d is 20 to 70.

9. A silicone rubber obtained by curing the thermally conductive polysiloxane composition according to claim 4.

10. An electronic part comprising the thermally conductive silicone grease according to claim 6.

11. The thermally conductive polysiloxane composition according to claim 3, which is of an addition-reaction curing type.

12. A silicone rubber obtained by curing the thermally conductive polysiloxane composition according to claim 11.

13. An electronic part comprising the silicone rubber according to claim 9.

14. An electronic part comprising the silicone rubber according to claim 12.

* * * * *